United States Patent
Aoyama

(10) Patent No.: US 10,546,871 B2
(45) Date of Patent: Jan. 28, 2020

(54) SEMICONDUCTOR MEMORY DEVICE AND METHOD OF MANUFACTURING THE SAME

(71) Applicant: Toshiba Memory Corporation, Minato-ku (JP)

(72) Inventor: Kenji Aoyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 77 days.

(21) Appl. No.: 15/262,340

(22) Filed: Sep. 12, 2016

(65) Prior Publication Data
US 2017/0278860 A1    Sep. 28, 2017

Related U.S. Application Data

(60) Provisional application No. 62/312,258, filed on Mar. 23, 2016.

(51) Int. Cl.
*H01L 27/11582* (2017.01)
*H01L 27/11556* (2017.01)
*H01L 23/528* (2006.01)

(52) U.S. Cl.
CPC .... *H01L 27/11582* (2013.01); *H01L 23/5283* (2013.01); *H01L 27/11556* (2013.01)

(58) Field of Classification Search
CPC ............ G11C 2213/70–2213/82; G11C 17/02–17/126; H01L 2924/145–2924/1453; H01L 27/11524; H01L 27/11529; H01L 27/11526
See application file for complete search history.

(56) References Cited

U.S. PATENT DOCUMENTS

| | | | | |
|---|---|---|---|---|
| 2014/0061750 | A1* | 3/2014 | Kwon | ............... H01L 27/1052 257/314 |
| 2016/0064281 | A1* | 3/2016 | Izumi | ............... H01L 21/76816 257/315 |
| 2016/0079069 | A1 | 3/2016 | Uenaka et al. | |
| 2017/0040337 | A1* | 2/2017 | Kim | ............... H01L 27/11582 |

FOREIGN PATENT DOCUMENTS

JP    2016-62950    4/2016

* cited by examiner

*Primary Examiner* — Moazzam Hossain
*Assistant Examiner* — Stanetta D Isaac
(74) *Attorney, Agent, or Firm* — Oblon, McClelland, Maier & Neustadt, L.L.P.

(57) ABSTRACT

A semiconductor memory device according to an embodiment comprises: a memory cell array region including a plurality of conductive layers that are electrically connected to a plurality of memory cells arranged in a first direction on a semiconductor substrate, the first direction intersecting a surface of the semiconductor substrate; a stepped part for contacting the plurality of conductive layers to a wiring line; a contact extending in the first direction and being connected to the conductive layer in the stepped part; and a plurality of columnar bodies extending in the first direction and penetrates the conductive layer in the stepped part and including a first columnar body having a first height and a second columnar body having a second height which is lower than the first height.

12 Claims, 22 Drawing Sheets

SEMICONDUCTOR MEMORY DEVICE AND METHOD OF MANUFACTURING THE SAME

CROSS REFERENCE TO RELATED APPLICATION

This application is based upon and claims the benefit of priority from U.S. Provisional Patent Application No. 62/312,258, filed on Mar. 23, 2016, the entire contents of which are incorporated herein by reference.

FIELD

An embodiment described herein relates to a semiconductor memory device and a method of manufacturing the same.

BACKGROUND

A flash memory that stores data by accumulating a charge in a charge accumulation layer or floating gate, is known. Such a flash memory is connected by a variety of systems, such as NAND type or NOR type, and configures a semiconductor memory device. In recent years, increasing of capacity and raising of integration level of such a semiconductor memory device have been proceeding. Moreover, a semiconductor memory device in which memory cells are disposed three-dimensionally (a three-dimensional type semiconductor memory device) has been proposed to achieve increased capacity and raised integration level of the semiconductor memory device. In addition, it is also being required that both increased capacity and miniaturization are achieved.

DETAILED DESCRIPTION

Figure 1:
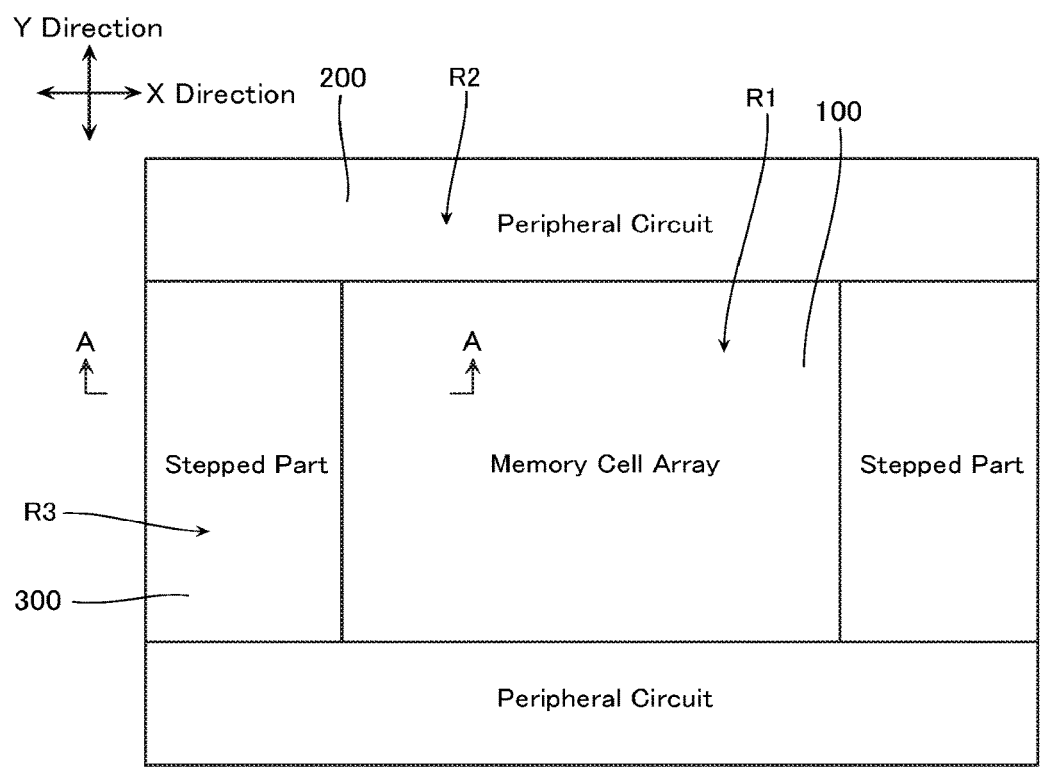
FIG. 1 is a plan view showing a schematic configuration of a semiconductor memory device according to a first embodiment.

A semiconductor memory device according to an embodiment comprises: a memory cell array region including a plurality of conductive layers that are electrically connected to a plurality of memory cells arranged in a first direction on a semiconductor substrate, the first direction intersecting a surface of the semiconductor substrate; a stepped part for contacting the plurality of conductive layers to a wiring line; a contact extending in the first direction and being connected to the conductive layer in the stepped part; and a plurality of columnar bodies extending in the first direction and penetrates the conductive layer in the stepped part and including a first columnar body having a first height and a second columnar body having a second height which is lower than the first height.

First Embodiment

[Configuration]

Next, a semiconductor memory device according to an embodiment will be described in detail with reference to the drawings. Note that this embodiment is merely an example. For example, each of the drawings of the semiconductor memory device employed in the embodiment below is schematic, and thicknesses, widths, ratios, and so on, of layers are not necessarily identical to those of the actual semiconductor memory device.

Moreover, the embodiment below relates to a semiconductor memory device having a structure in which a plurality of MONOS (Metal-Oxide-Nitride-Oxide-Semiconductor) type memory cells (transistors) are stacked along a direction intersecting a surface of a substrate (a Z direction in the drawings referred to hereafter), on the substrate, each of the MONOS type memory cells including: a semiconductor film acting as a channel provided in a column shape in the Z direction; and a gate electrode film provided, via a charge accumulation layer, on a side surface of the semiconductor film. However, the memory cell may be a memory cell of another form, for example, a SONOS (Semiconductor-Oxide-Nitride-Oxide-Semiconductor) type memory cell or MANOS (Metal-Aluminum Oxide-Nitride-Oxide-Semiconductor) type memory cell, or a floating gate type memory cell.

First Embodiment

FIG. 1 is a plan view showing a schematic configuration of a semiconductor memory device according to a first embodiment. The semiconductor memory device according to the first embodiment comprises a memory cell array 100 provided on a substrate 101 used as a memory chip. Provided in a periphery of the memory cell array 100 are a peripheral circuit 200 and a stepped part 300.

The memory cell array 100 comprises a plurality of memory cells arranged three-dimensionally therein.

The peripheral circuit 200 is connected to the memory cell array 100 via a plurality of bit lines and a plurality of word lines. The peripheral circuit 200 is configured from a CMOS circuit provided on the substrate 101, and functions as a decoder, a sense amplifier, a state machine, a voltage generating circuit, and so on.

In the stepped part 300, a wiring line led out from the memory cell is formed in a stepped shape. Moreover, the stepped part 300 is provided on both sides of X direction sides of the memory cell array 100.

Note that in the description below, a region on the substrate 101 provided with the memory cell array 100 will be called a memory cell array region R1, a region on the substrate 101 provided with the peripheral circuit 200 will be called a peripheral circuit region R2, and a region on the substrate 101 provided with the stepped part 300 will be called a stepped region R3.

Figure 2:
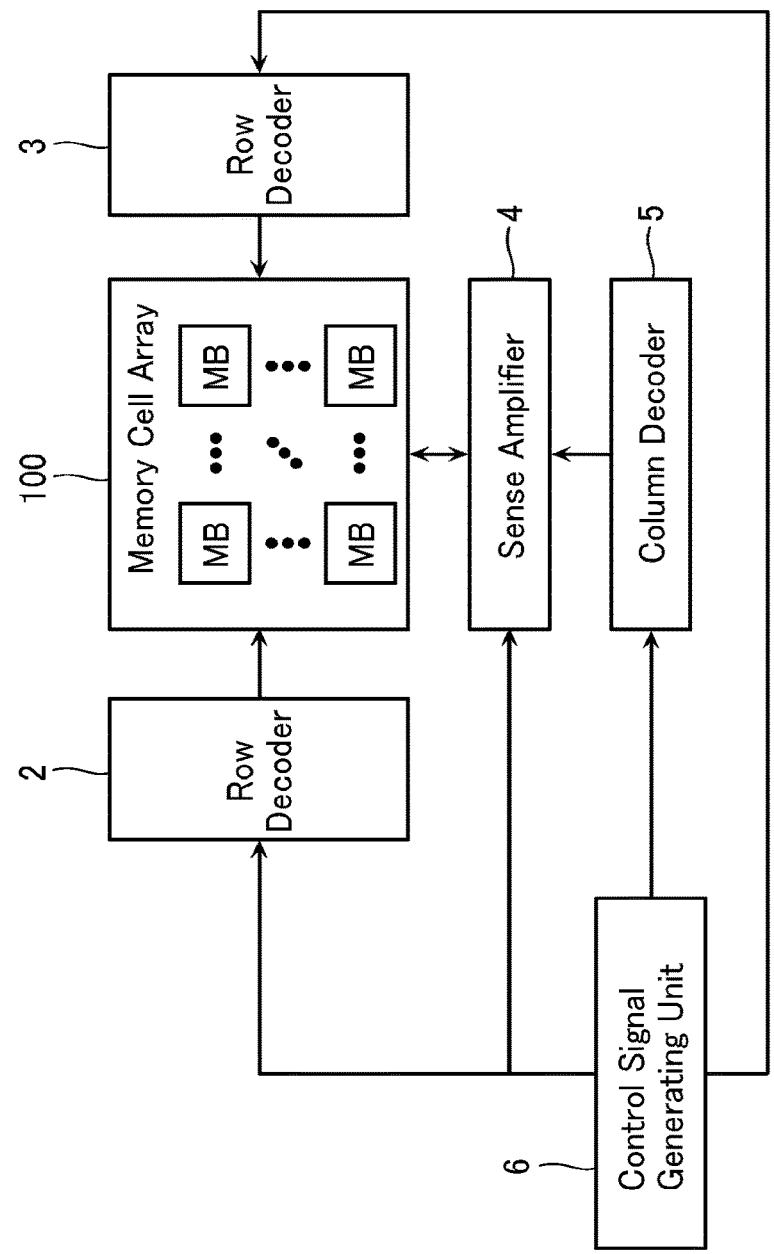
FIG. 2 is a functional block diagram showing a schematic configuration of the semiconductor memory device according to the first embodiment.

FIG. 2 is a functional block diagram showing a configuration of the semiconductor memory device according to the first embodiment. The semiconductor memory device according to the embodiment comprises: the memory cell array 100; row decoders 2 and 3; a sense amplifier 4; a column decoder 5; and a control signal generating unit 6. The memory cell array 100 includes a plurality of memory blocks MB. Each of the memory blocks MB includes a plurality of memory cells MC (not illustrated; mentioned later in FIG. 3) arranged three-dimensionally therein. The row decoders 2 and 3 decode a downloaded block address signal, and so on, and control a write operation and a read operation of data of the memory cell array 100. The sense amplifier 4 detects and amplifies an electrical signal flowing in the memory cell array 100 during the read operation. The column decoder 5 decodes a column address signal and controls the sense amplifier 4. The control signal generating unit 6, in addition to boosting a reference voltage and generating a voltage employed during write, erase or the read operation, generates a control signal and controls the row decoders 2 and 3, the sense amplifier 4, and the column decoder 5.

Figure 3:
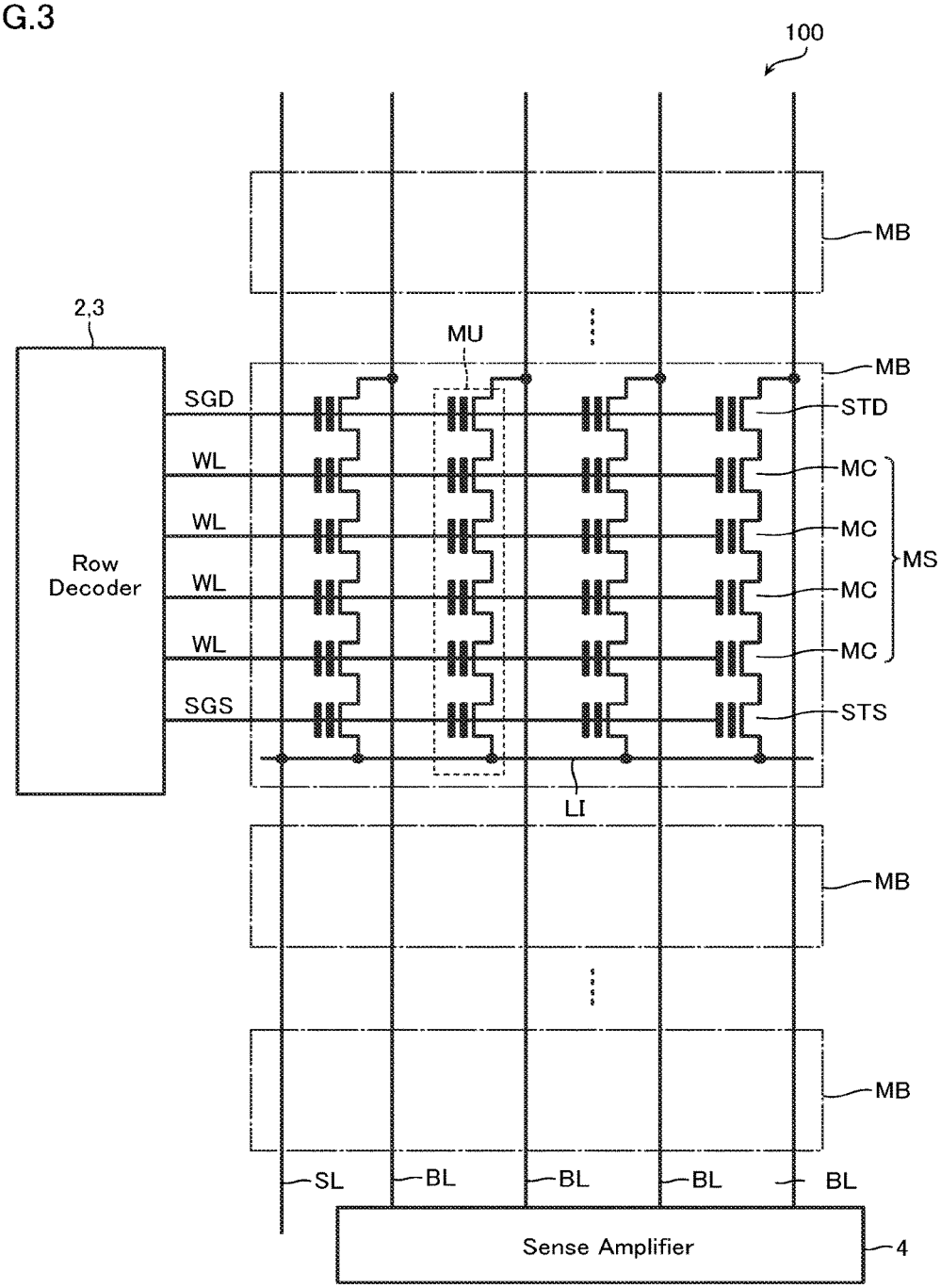
FIG. 3 is an equivalent circuit diagram showing a configuration of a memory cell array 100 of the same semiconductor memory device.

FIG. 3 is an equivalent circuit diagram showing a configuration of part of the memory cell array 100 according to the present embodiment.

The memory cell array 100 according to the present embodiment comprises the plurality of memory blocks MB. Moreover, a plurality of bit lines BL and a source line SL are commonly connected to these plurality of memory blocks MB. Each of the memory blocks MB is connected to the sense amplifier via the bit line BL and to an unillustrated source line driver via the source line SL.

The memory block MB comprises a plurality of memory units MU each having its one end connected to the bit line BL and having its other end connected, via a source contact LI, to the source line SL.

The memory unit MU comprises a plurality of the memory cells MC connected in series. As will be mentioned later, the memory cell MC comprises: a semiconductor layer; a charge accumulation layer; and a control gate. In addition, during various operations, a charge is accumulated in the charge accumulation layer (write operation), moreover, a charge is erased from the charge accumulation layer (erase operation), based on a voltage applied to the control gate, whereby a threshold value of the memory cell MC is changed. Data stored in the memory cell MC is determined (read operation) by detecting a magnitude of this threshold value. Note that hereafter, the plurality of memory cells MC connected in series will be called a "memory string MS".

Commonly connected to the control gates of pluralities of the memory cells MC configuring different memory strings MS are, respectively, word lines WL. These pluralities of memory cells MC are connected to the row decoder via the word lines WL.

The memory unit MU comprises a drain side select gate transistor STD connected between the memory string MS and the bit line BL. Connected to a control gate of the drain side select gate transistor STD is a drain side select gate line SGD. The drain side select gate line SGD is connected to the row decoder and selectively connects the memory string MS and the bit line BL based on an inputted signal.

The memory unit MU comprises a source side select gate transistor STS connected between the memory string MS and the source contact LI. Connected to a control gate of the source side select gate transistor STS is a source side select gate line SGS. The source side select gate line SGS is connected to the row decoder and selectively connects the memory string MS and the source line SL based on an inputted signal.

Figure 4:
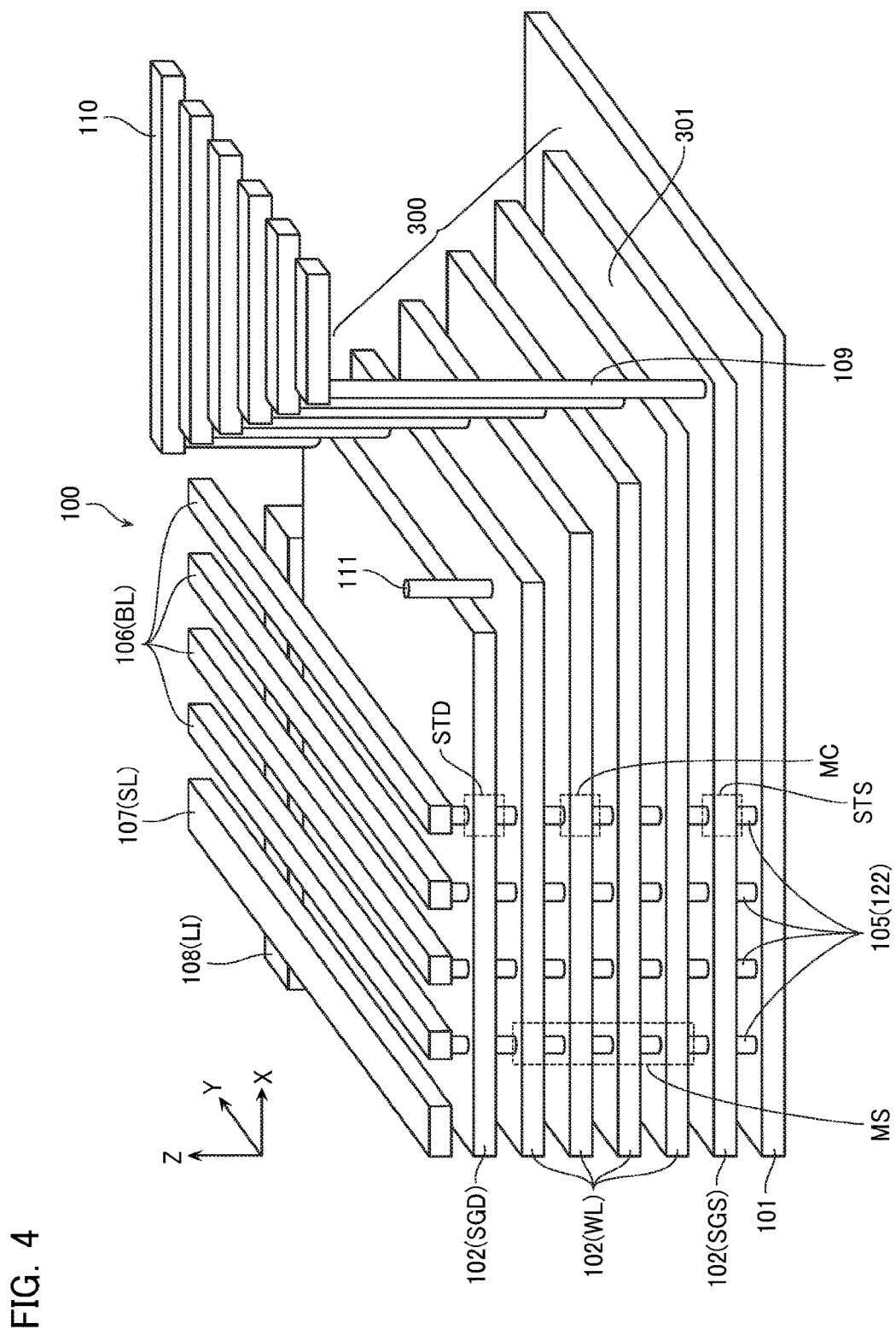
FIG. 4 is a perspective view showing a configuration of the memory cell array 100 of the same semiconductor memory device.

FIG. 4 is a schematic perspective view showing a configuration of part of the memory cell array 100. Note that in FIG. 4, in order to explain mainly a principal portion of the memory cell array 100, such as a conductive layer, part of the configuration, such as an insulating layer, is omitted.

The memory cell array 100 according to the present embodiment comprises: the substrate 101; and a plurality of conductive layers 102 stacked in the Z direction, via an unillustrated inter-layer insulating layer, on the substrate 101. In addition, the memory cell array 100 includes a plurality of columnar semiconductors 105 extending in the Z direction. An intersection of the conductive layer 102 and the columnar semiconductor 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

A conductive layer 106 functioning as the bit line BL and a conductive layer 107 functioning as the source line SL are disposed above the conductive layer 102.

The memory cell array 100 comprises a conductive layer 108 that faces side surfaces in a Y direction of the plurality of conductive layers 102 and extends in the X direction. A lower surface of the conductive layer 108 contacts the substrate 101. The conductive layer 108 is configured from a conductive layer of the likes of tungsten (W), for example, and functions as the source contact LI.

The plurality of conductive layers 102 are formed in a stepped shape at their ends in the X direction and configure the stepped part 300. In other words, the stepped part 300 includes the conductive layer 102. A height of the conductive layer 102 included in the stepped part 300 lowers with increasing distance from the memory cell array region R1.

A contact part 301 is formed at an extremity of each step configuring the stepped part 300. In other words, the contact part 301 is a portion of a conductive layer 102 included in the stepped part 300 where an extremity of that conductive layer 102 projects more to the X direction side than an extremity of the conductive layer 102 adjacent to it upwardly in the Z direction. A contact 109 is disposed in the contact part 301. The contact 109 is connected to an upper wiring line 110.

Moreover, a support column 111 is disposed in the contact part 301. The support column 111 extends in the Z direction to penetrate the stepped part 300. The support column 111 functions to maintain a posture of a stacked structure of the memory cell array 100 in a later-described step of replacing a sacrifice layer with a conductive layer. To simplify explanation, only one support column 111 is shown, but a plurality of support columns 111 may be provided.

Figure 5:
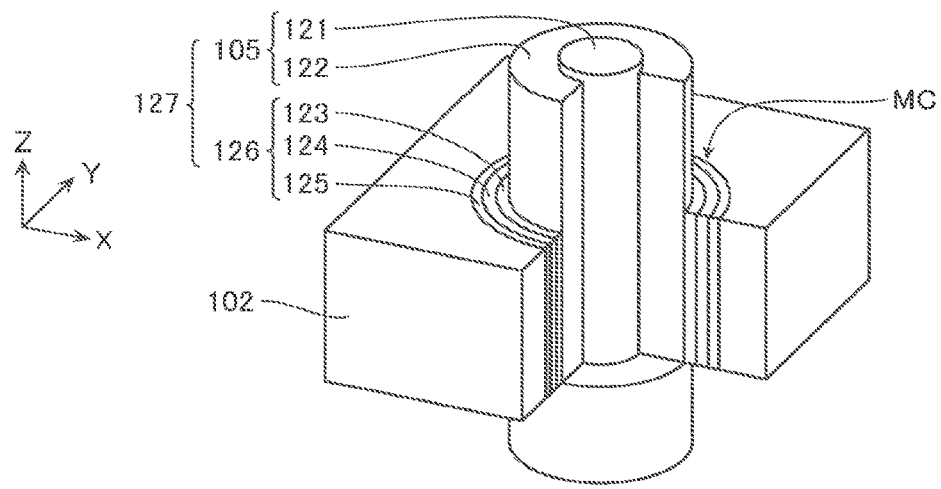
FIG. 5 is a schematic perspective cross-sectional view showing an example of configuration of one memory cell MC included in the same semiconductor memory device.

FIG. 5 is a schematic perspective view showing a configuration of the memory cell MC. Note that FIG. 5 shows the configuration of the memory cell MC, but the source side select gate transistor STS and the drain side select gate transistor STD may also be configured similarly to the memory cell MC. Moreover, in FIG. 5, in order to explain mainly a principal configuration of the memory cell MC, such as a conductive layer, a memory layer, or a semiconductor layer, part of the configuration, such as an insulating layer disposed above/below the conductive layer 102 or a barrier metal layer, is omitted.

The memory cell MC is provided so as to extend in the Z direction, at an intersection of the conductive layer 102 and the columnar semiconductor 105. The columnar semiconductor 105 comprises: a core insulating layer 121; and a semiconductor layer 122. The semiconductor layer 122 covers a peripheral sidewall of the core insulating layer 121. Furthermore, a memory film 126 is provided on a peripheral side surface of the semiconductor layer 122. The memory film 126 includes: a tunnel insulating layer 123 provided on the side surface of the semiconductor layer 122; a charge accumulation layer 124 provided on a side surface of the tunnel insulating layer 123; and a block insulating layer 125 provided on a side surface of the charge accumulation layer 124. Moreover, the conductive layer 102 is provided in a periphery of the block insulating layer 125.

The core insulating layer 121 is configured from an insulating layer of the likes of silicon oxide, for example. The semiconductor layer 122 is configured from a semiconductor layer of the likes of polysilicon, for example. Moreover, the semiconductor layer 122 functions as a channel body of the memory cell MC, the source side select gate transistor STS, and the drain side select gate transistor STD. The tunnel insulating layer 123 is configured from an insulating layer of the likes of silicon oxide, for example. The charge accumulation layer 124 is configured from an insulating layer capable of accumulating a charge, of the likes of silicon nitride, for example. The block insulating layer 125 is configured from, for example, silicon oxide or from a metal oxide such as hafnium oxide, aluminum oxide, zirconium oxide, titanium oxide, or tantalum oxide whose permittivity is higher than that of silicon oxide, or from a stacked body of these. Note that hereafter, the columnar semiconductor 105 and the memory film 126 will be collectively called a memory columnar body 127.

Figure 6:
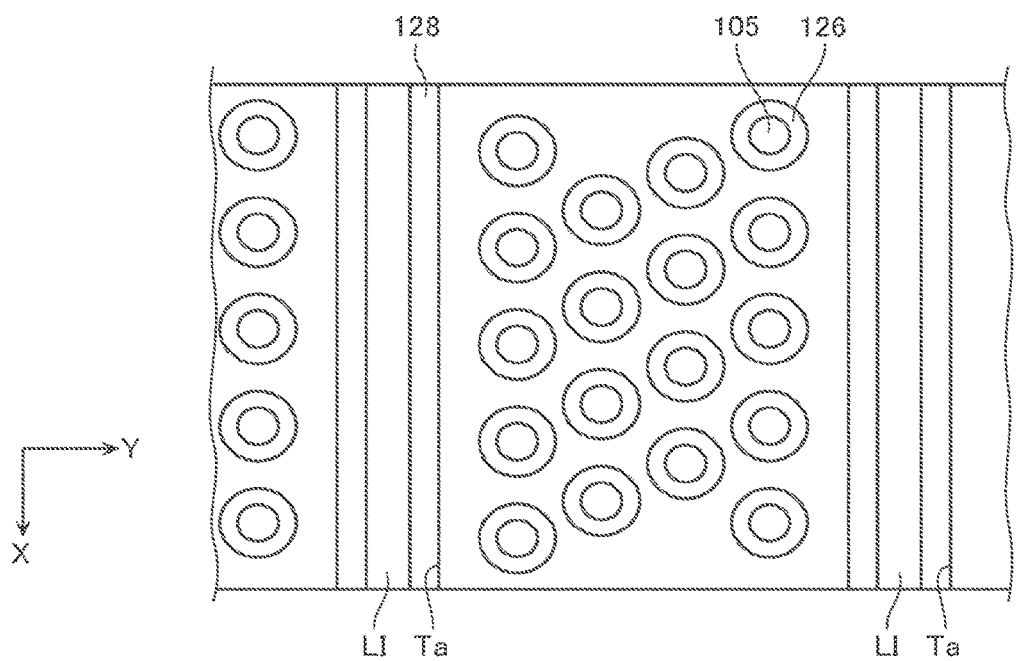
FIG. 6 is a plan view showing a configuration of part of the memory cell array 100 included in the same semiconductor memory device.
Figure 7A:
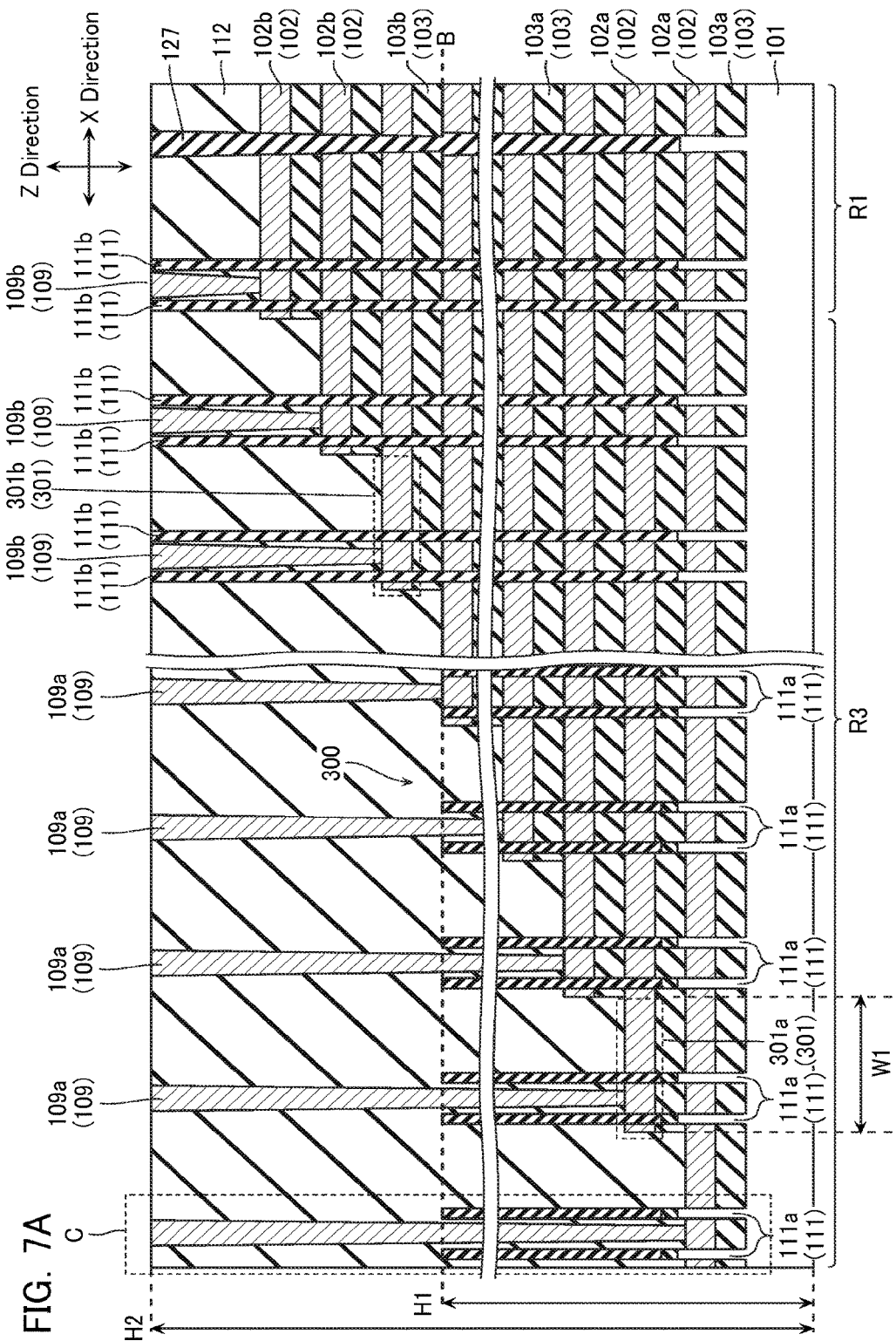
FIG. 7A is a schematic cross-sectional view showing a configuration of the same semiconductor memory device.
Figure 7B:
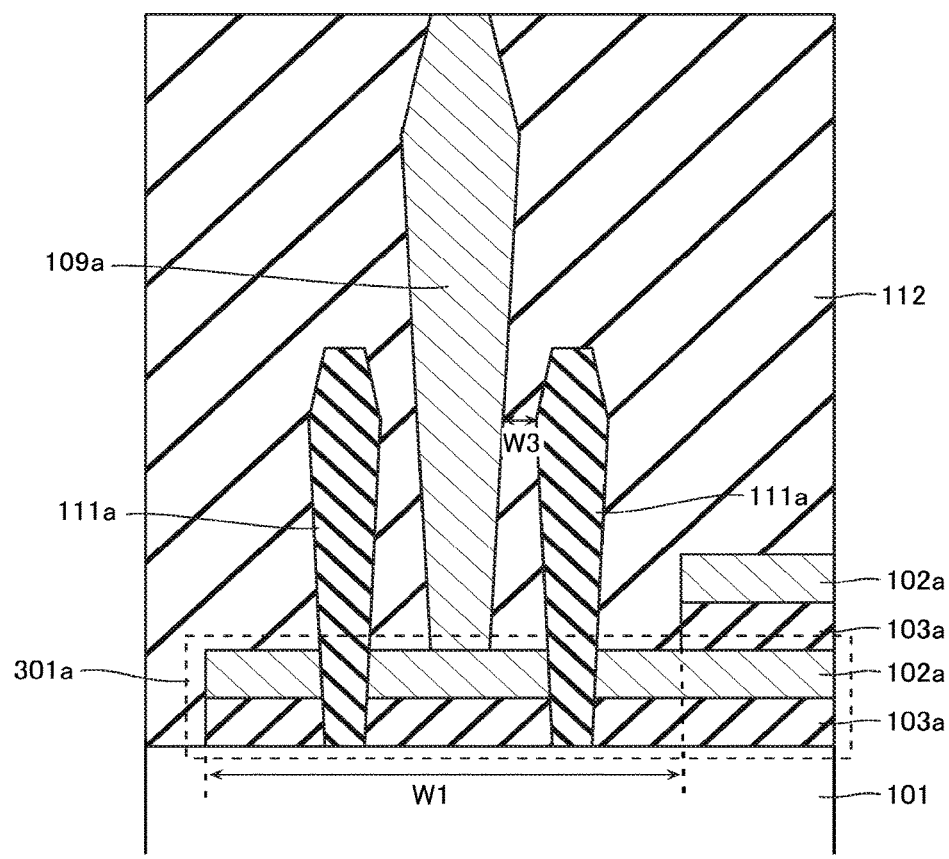
FIG. 7B is an enlarged view of the dotted line C portion in FIG. 7A.

FIG. 6 is a plan view showing a configuration of part of the memory cell array 100; and FIG. 7A is a cross-sectional view along the Y direction (a cross-sectional view taken along the line A-A of FIG. 1) of the memory cell array 100 and the stepped part 300. FIG. 7B is an enlarged view of a portion indicated by the dotted line C of FIG. 7A.

As shown in FIG. 6, in the present embodiment, the columnar semiconductors 105 are arranged staggered. In addition, the source contact LI is formed in a striped shape having the X direction as its longitudinal direction. This source contact LI is implanted, via an inter-layer insulating film 128, in a trench Ta that divides the memory cell array 100 in a block unit.

As shown in FIG. 7A, in the semiconductor memory device according to the present embodiment, in the memory cell array region R1 where the memory columnar body 127 is provided, a plurality of the conductive layers 102 are stacked in the Z direction via an inter-layer insulating layer 103. The conductive layer 102 includes: a conductive layer 102a stacked to a height H1 indicated by the dotted line B; and a conductive layer 102b stacked from the height H1 to a height H2 more upward than the height H1. Similarly, the inter-layer insulating layer 103 includes: an inter-layer insulating layer 103a stacked to the height H1; and an inter-layer insulating layer 103b stacked from the height H1 to the height H2.

The plurality of conductive layers 102 extend in the X direction so as to straddle from the memory cell array region R1 to the stepped region R3, and configure the stepped part 300. An extremity of the conductive layer 102 of each step of the stepped part 300 configures the contact part 301.

The contact part 301 includes: a contact part 301a provided in the stepped part 300 from a surface of the substrate 101 to the height H1; and a contact part 301b provided in the stepped part 300 from the height H1 to the height H2.

The contact 109 is provided in the contact part 301. The contact 109 includes: a contact 109a provided in the contact part 301a; and a contact 109b provided in the contact part 301b. Positions of upper surfaces of each of the contacts 109 are aligned with the height H2.

Moreover, in the present embodiment, the support column 111 is provided penetrating the contact part 301. The support column 111 includes: a support column 111a which is provided penetrating the contact part 301a and has the height H1 from the surface of the substrate 101; and a support column 111b which is provided penetrating the contact part 301b and has the height H2 higher than the height H1.

Moreover, in the present embodiment, the support column 111 is provided in plurality in each contact part 301 and is disposed so as to surround the contact 109 provided in the contact part 301. However, the support column 111 is not necessarily required to surround the contact 109 and may be configured to be disposed at a position separated from the contact 109.

In this way, in the present embodiment, a height of an upper surface of the contact 109a provided in the contact part 301a is H2, while a height of the support column 111a surrounding the contact 109a is H1 which is lower than H2. Moreover, an upper surface height of the contact 109b provided in the contact part 301b and the height H2 of the support column 111b surrounding the contact 109b are aligned with H2.

FIG. 7B is an enlarged view in which the portion surrounded by the dotted line C is shown schematically enlarged. The contact 109a and the support column 111a each have a tapered shape (also called a bow shape) where, from a downward to an upward Z direction, their width (cross-sectional size in the XY plane) increases, and then, from along the way, that width decreases.

Figure 7C:
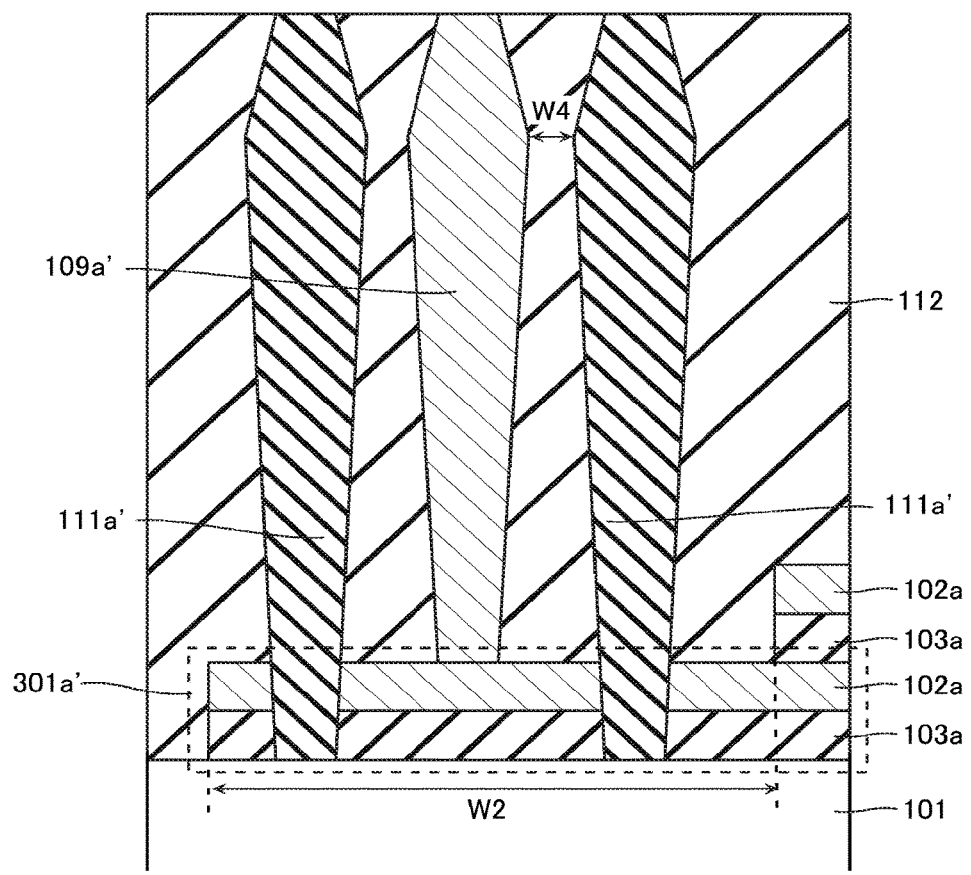
FIG. 7C is a reference view showing a comparative example.

Therefore, as shown in a reference view FIG. 7C showing a comparative example, if an upper surface of a contact 109a' and an upper surface of a support column 111a' are assumed to have the same height, then fellow portions of broadest width of the contact 109a' and the support column 111a' end up coming close. A distance where these fellow portions of broadest width of the contact 109a' and the support column 111a' come close is assumed to be W4. Moreover, in FIG. 7B, a distance between the contact 109a and a portion at the position where the width of the support column 111a is broadest, is assumed to be W3.

Now, sometimes, due to the likes of an error in a manufacturing step, positions of the contact 109a and the support column 111a end up being misaligned from a setting, and the contact 109a and the support column 111a end up contacting each other. This tendency becomes more prominent the larger the number of stacked layers of conductive layers 102 becomes. Moreover, the inside of the support column 111a sometimes includes a semiconductor material such as polysilicon or a conductive material, and, for example, there is a risk that, for some reason (for example, film thinning of an insulating film covering the conductive material, and so on), these later-to-be-described semiconductor material or conductive material and the contact 109a end up contacting each other or short-circuiting, and memory cell characteristics end up significantly deteriorating.

Therefore, in order to prevent contact between the contact 109a and the support column 111a, the distance W3 between the contact 109a and the support column 111a needs to be sufficiently secured. However, if as far as processing variation is taken into consideration to make a design securing a margin of that distance W3, then there is a possibility that density of a region where the contact 109a and the support column 111a are disposed cannot be raised, leading to area increase.

On the other hand, in the present embodiment, by making the height H1 of the upper surface of the support column 111a lower than the height H2 of the contact 109a as shown in FIG. 7A, it is made possible that fellow portions of broadest width of the contact 109a and the support column 111a never come close and that a shortest distance between the two is set to the distance W3 which is larger than the previously mentioned distance W4. Therefore, compared to the case where the upper surface of the contact 109a and the upper surface of the support column 111a are at the same height, there is no need for the margin of the distance W3 to be secured in large measure, and area increase does not occur.

Furthermore, due to it being possible for the distance W3 between the contact 109a and the support column 111a to be sufficiently secured, it becomes possible for a width W1 of a step of the contact part 301a to be more reduced compared to a width W2 of a step of a contact part 301a' in FIG. 7C.

As a result, it becomes possible to reduce area in the device overall. Moreover, area of the conductive layer 102a is reduced to the extent that area of the contact part 301a has been reduced. Therefore, resistance of the conductive layer 102a functioning as the word line WL can also be reduced, and cell characteristics, particularly current characteristics improve.

Note that a ratio of the heights H1 and H2 is determined based on a variety of conditions, so as to achieve a sufficient area reduction. For example, in the present embodiment, the height H1 is set to not less than half of the height H2. Now, film thicknesses of each of the conductive layers 102 and each of the inter-layer insulating layers 103 are set about the same. Therefore, the ratio of the height H1 and the height H2 will be a ratio of the numbers of layers of conductive layers 102 and inter-layer insulating layers 103 included up to those respective heights H1 and H2. It results from this that if the height H1 is not less than half of the height H2, then the number of layers included up to the height H1 is not less than half of the number of layers included up to the height H2.

Moreover, in the present embodiment, a material configuring the support column 111a and a material configuring the support column 111b are different. This is due to a later-described method of manufacturing. Specifically, the support column 111a is, for example, all an insulator, or is a structure whose periphery is covered by an insulator and whose inside includes a conductor such as silicon. Employed as the insulator is a silicon oxide film or the like. Moreover, the support column 111b has the same configuration as the memory columnar body 127. That is, the support column 111b is configured from a stacked structure of the columnar semiconductor 105 (the core insulating layer 121 and the semiconductor layer 122 covering its peripheral side surface) and the memory film 126 covering the peripheral side surface of the columnar semiconductor 105, that were described in FIG. 5. The previously described support column 111a may also have a similar structure to the support column 111b.

[Method of Manufacturing]

The method of manufacturing according to the present embodiment will be described using FIGS. 8 to 18.

Figure 8:
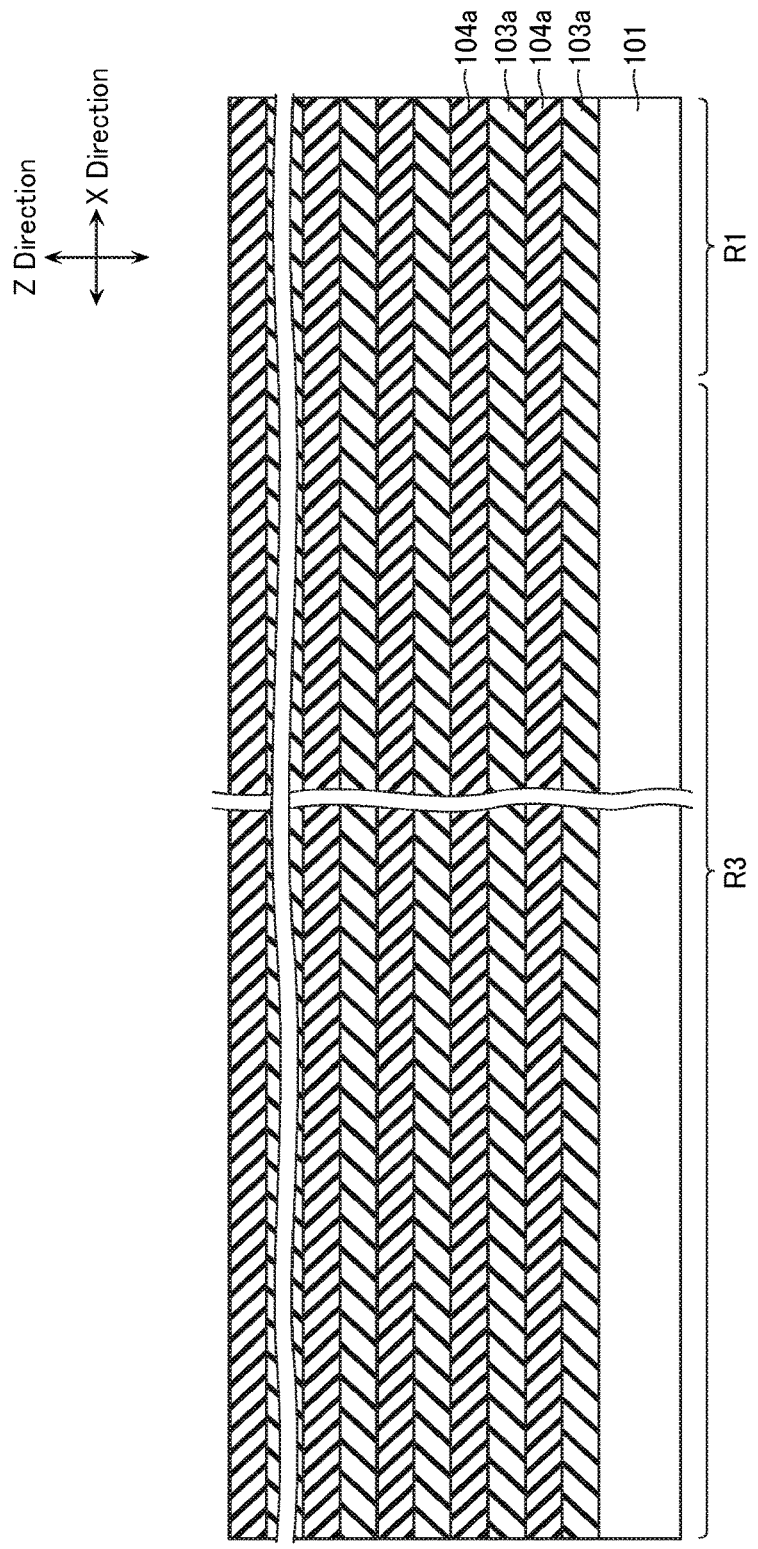
FIGS. 8 to 18 are schematic cross-sectional views showing a method of manufacturing the same semiconductor memory device.

As shown in FIG. 8, a plurality of the inter-layer insulating layers 103a and sacrifice layers 104a are stacked alternately on the semiconductor substrate 101. The sacrifice layer 104a is configured from silicon nitride, for example.

Figure 9:
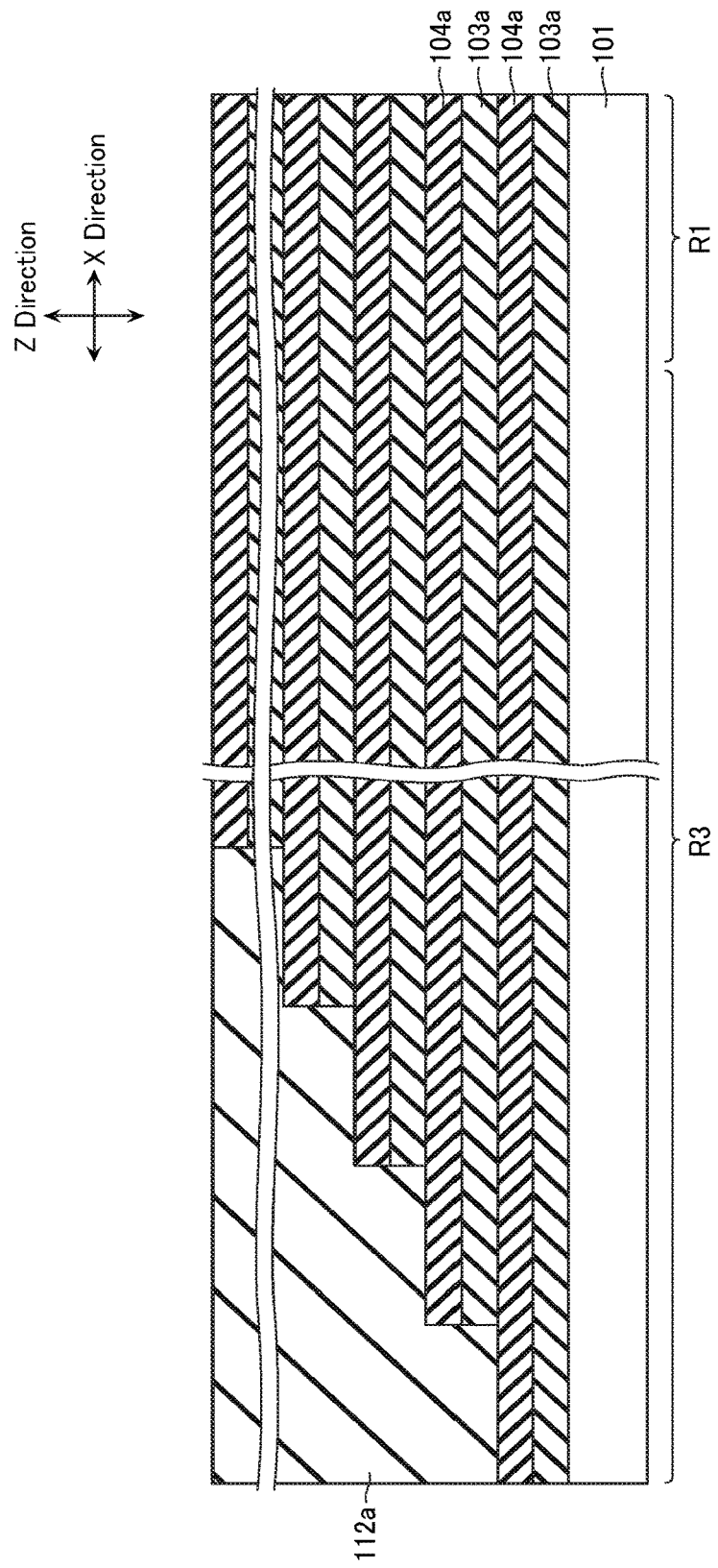

As shown in FIG. 9, the stacked inter-layer insulating layers 103a and sacrifice layers 104a are processed into a stepped shape, and an inter-layer insulating layer 112a is formed by using a deposition method such as CVD. Other layers described below are similarly formed as the inter-layer insulating layer 112a. The inter-layer insulating layer 112a is configured from silicon oxide, for example.

Figure 10:
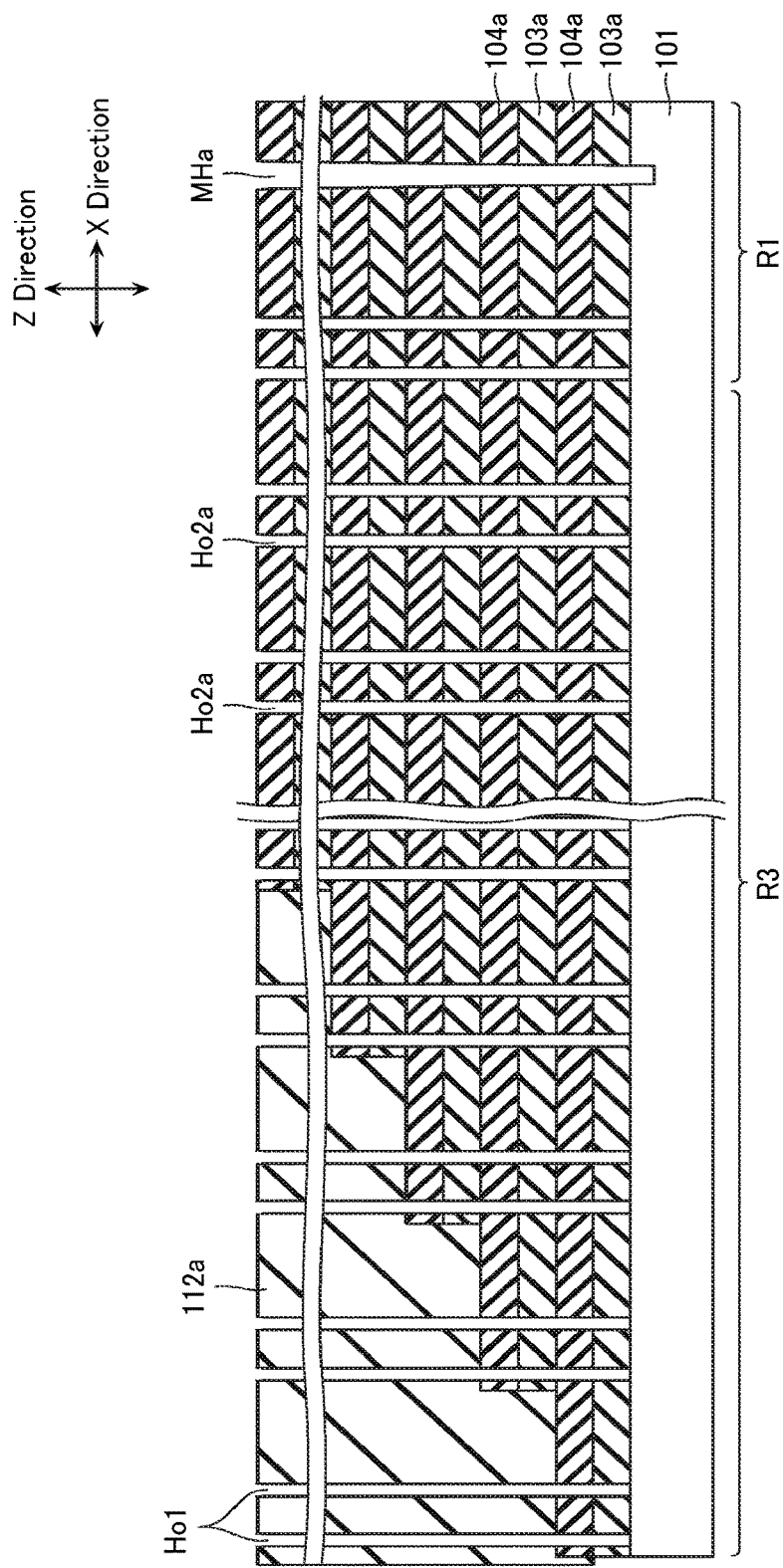

As shown in FIG. 10, in the memory cell array region R1, patterning of a desired pattern corresponding to a memory hole MH is performed by lithography, and a first memory hole MHa is formed by RIE or wet etching. Moreover, in the stepped region R3, similarly, patterning of a desired pattern corresponding to the support column 111a and the support column 111b is performed by lithography, and a hole Ho1 and a hole Ho2a are formed by RIE or wet etching.

Figure 11:
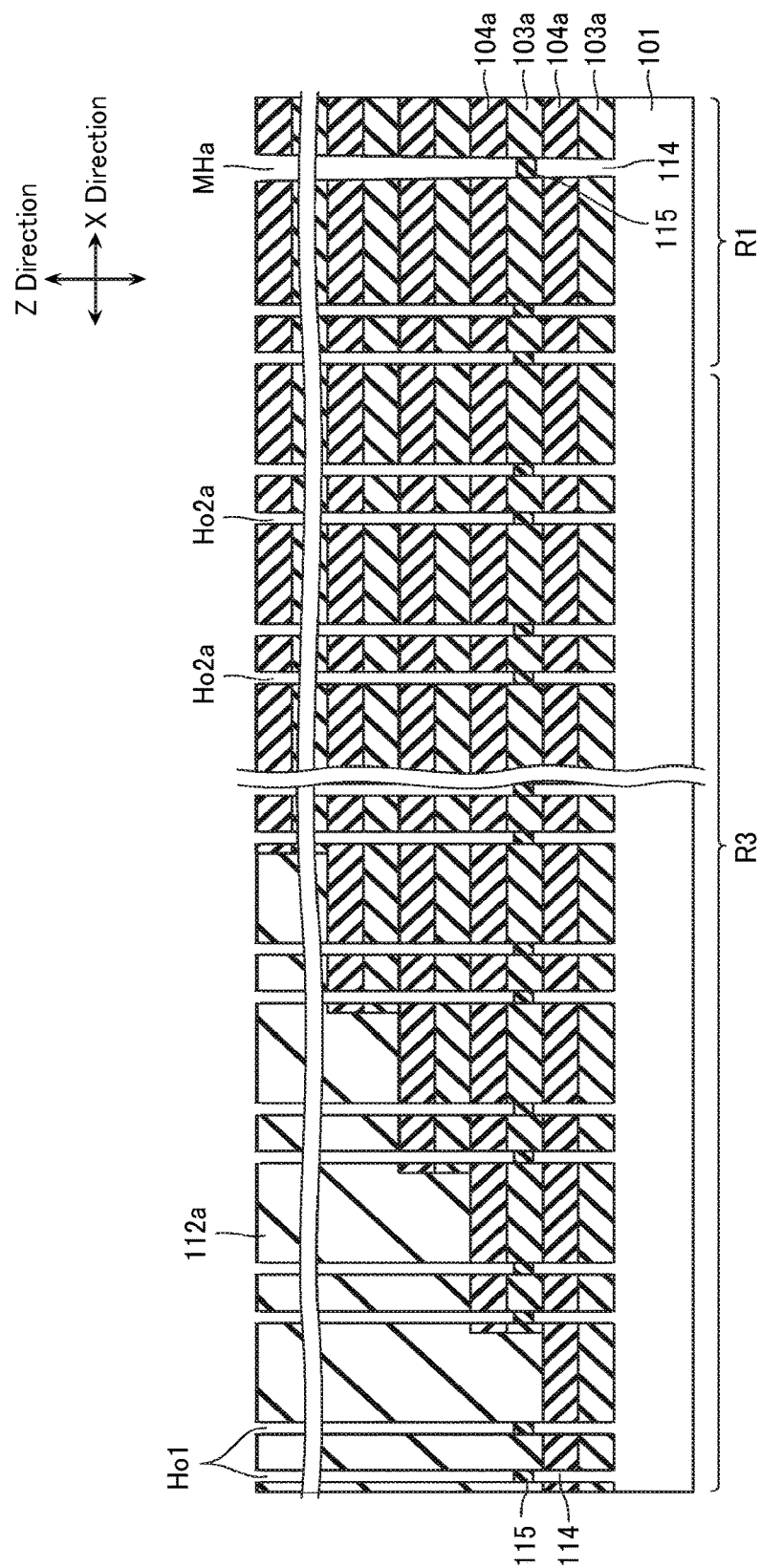

As shown in FIG. 11, the substrate 101 exposed at bottom surfaces of the first memory hole MHa, the hole Ho1, and the hole Ho2a is epitaxially grown to form an epitaxial layer 114, and a surface of that epitaxial layer 114 is further plasma oxidized or thermally oxidized to form an oxide layer 115. These epitaxial layer 114 and oxide layer 115 function as a stopper of a later-formed sacrifice layer 113.

Figure 12:
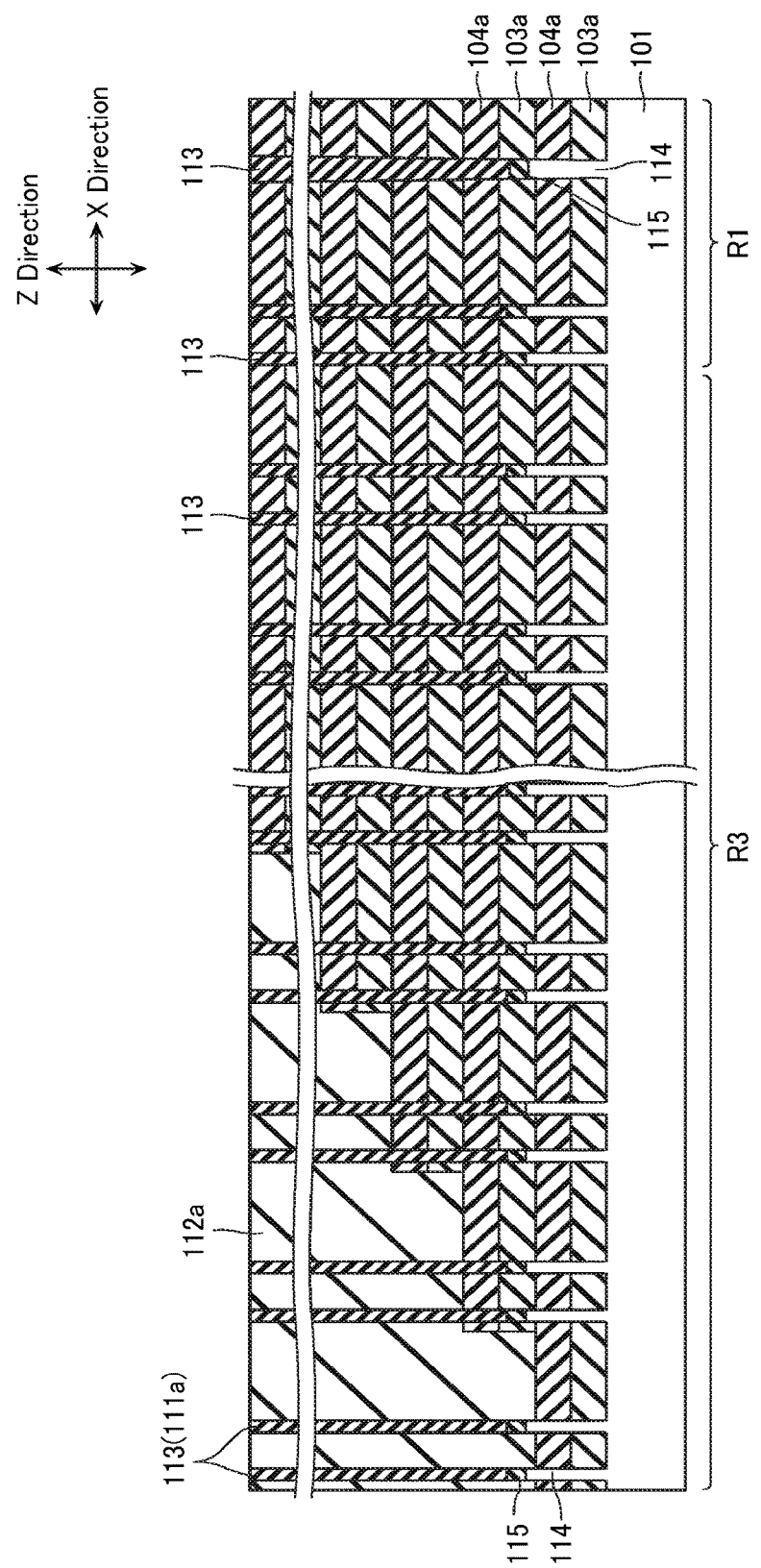

As shown in FIG. 12, the sacrifice layer 113 is formed in the first memory hole MHa, the hole Ho1, and the hole Ho2a. The sacrifice layer 113 is, for example, configured from an insulator such as silicon oxide, or from a structure configured from an insulator such as silicon oxide formed on inner walls of the first memory hole MHa, the hole Ho1, and the hole Ho2a, and a conductive material such as silicon formed on the inside of that insulator. The sacrifice layer 113 formed in the hole Ho1 configures the support column 111a.

Figure 13:
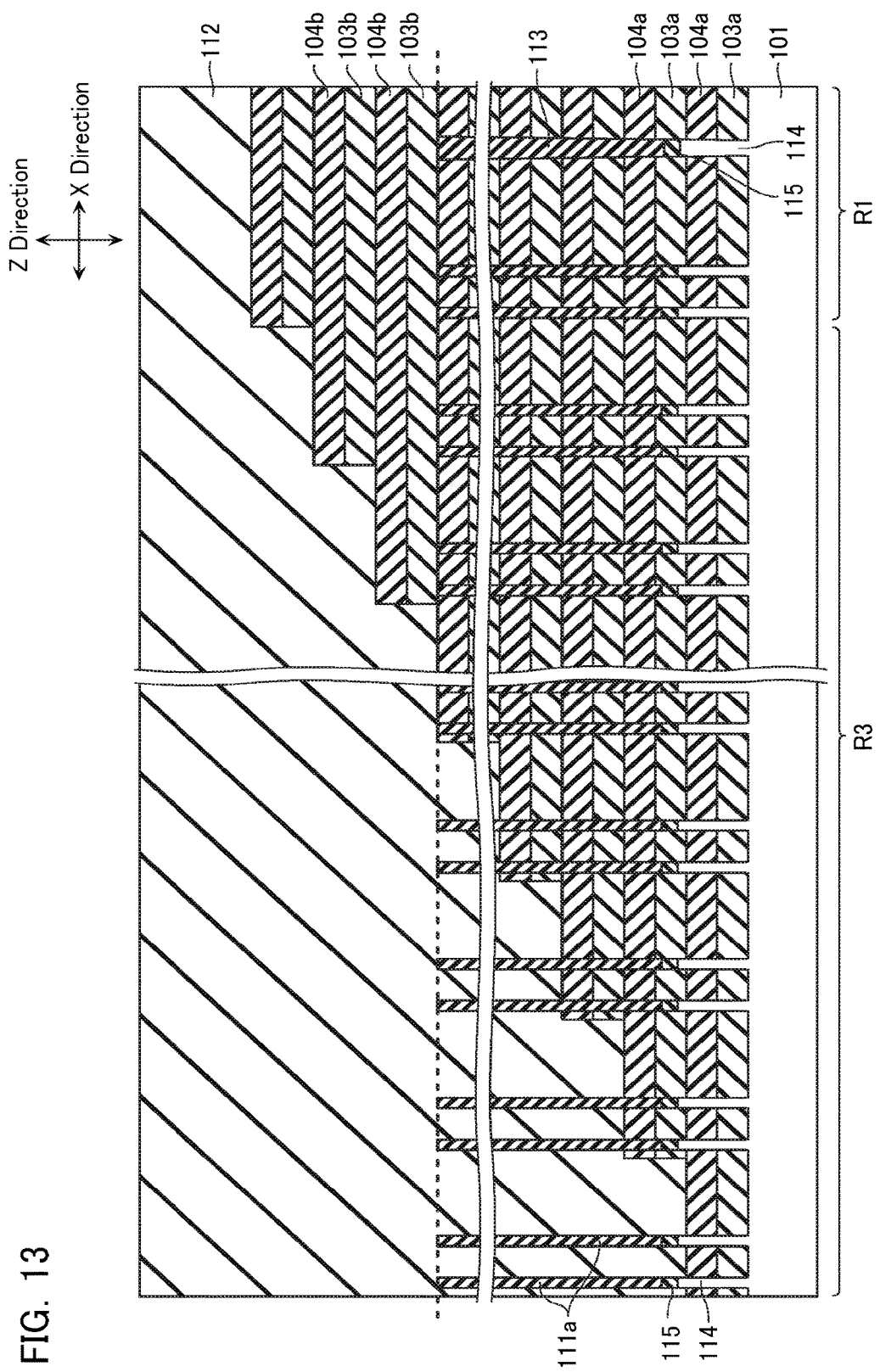

As shown in FIG. 13, the inter-layer insulating layers 103b and sacrifice layers 104b are further stacked, formed into a stepped shape, and buried by an inter-layer insulating layer 112.

Figure 14:
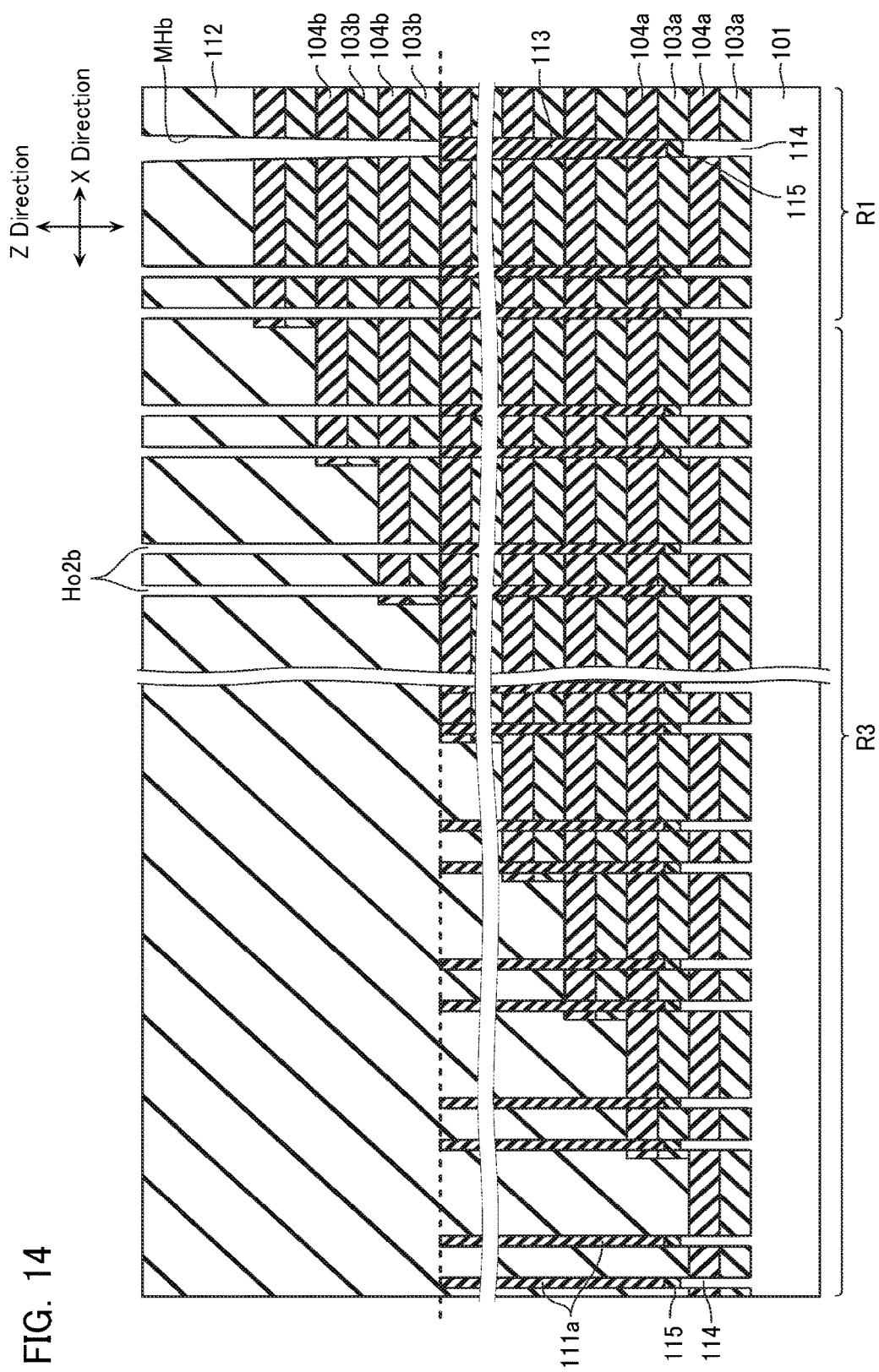

As shown in FIG. 14, in the memory cell array region R1, patterning of a desired pattern corresponding to the memory hole MH is performed by lithography, and a second memory hole MHb is formed by RIE or wet etching. Moreover, in the stepped region R3, similarly, patterning of a desired pattern corresponding to the support column 111b is performed by lithography, and a hole Ho2b is formed by RIE or wet etching.

Figure 15:
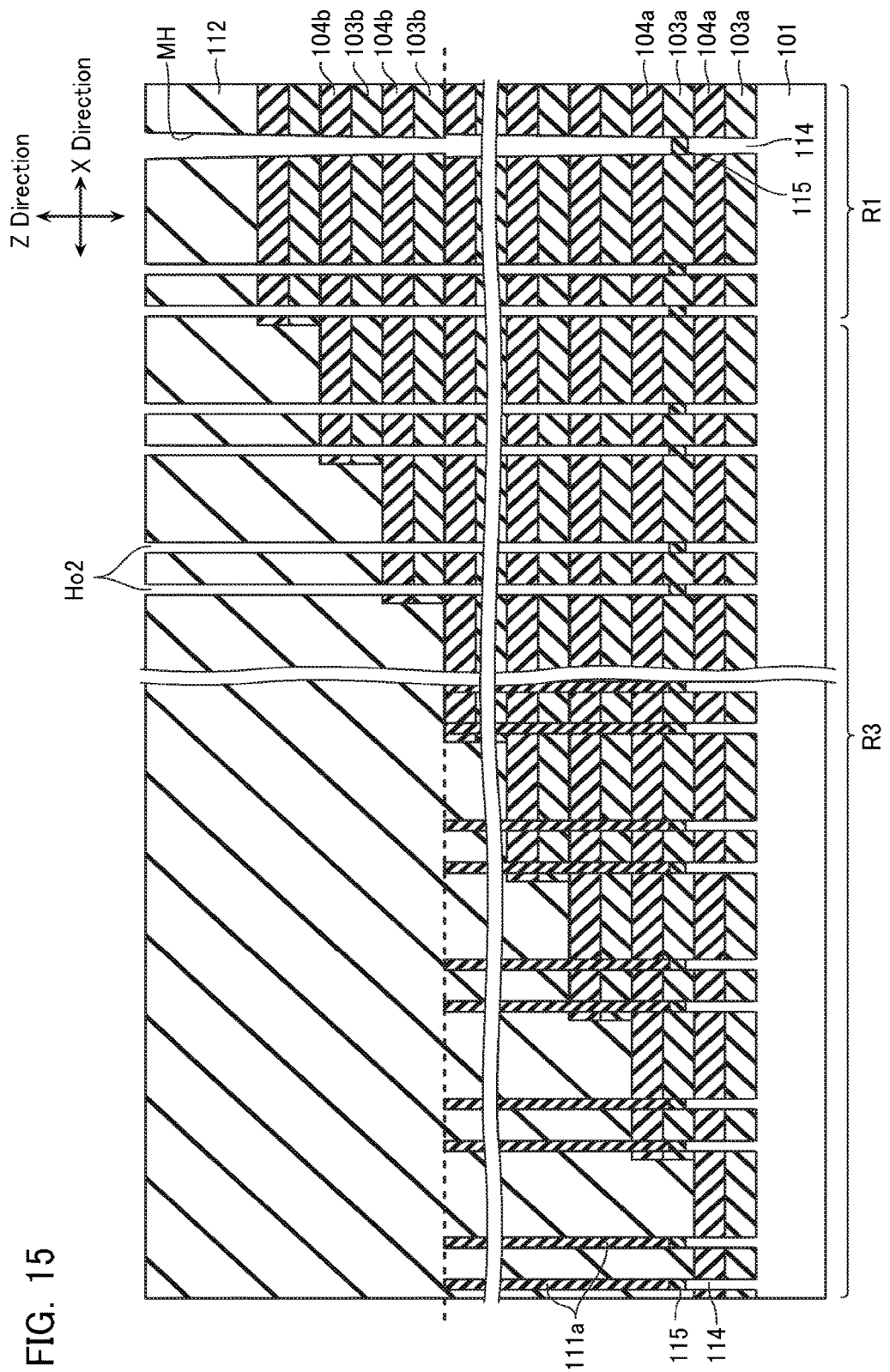

As shown in FIG. 15, the sacrifice layer 113 formed in the first memory hole MHa and the hole Ho2a is removed by the likes of etching via the second memory hole MHb and the hole Ho2b. In this way, the memory hole MH and the hole Ho2 are formed.

Figure 16:
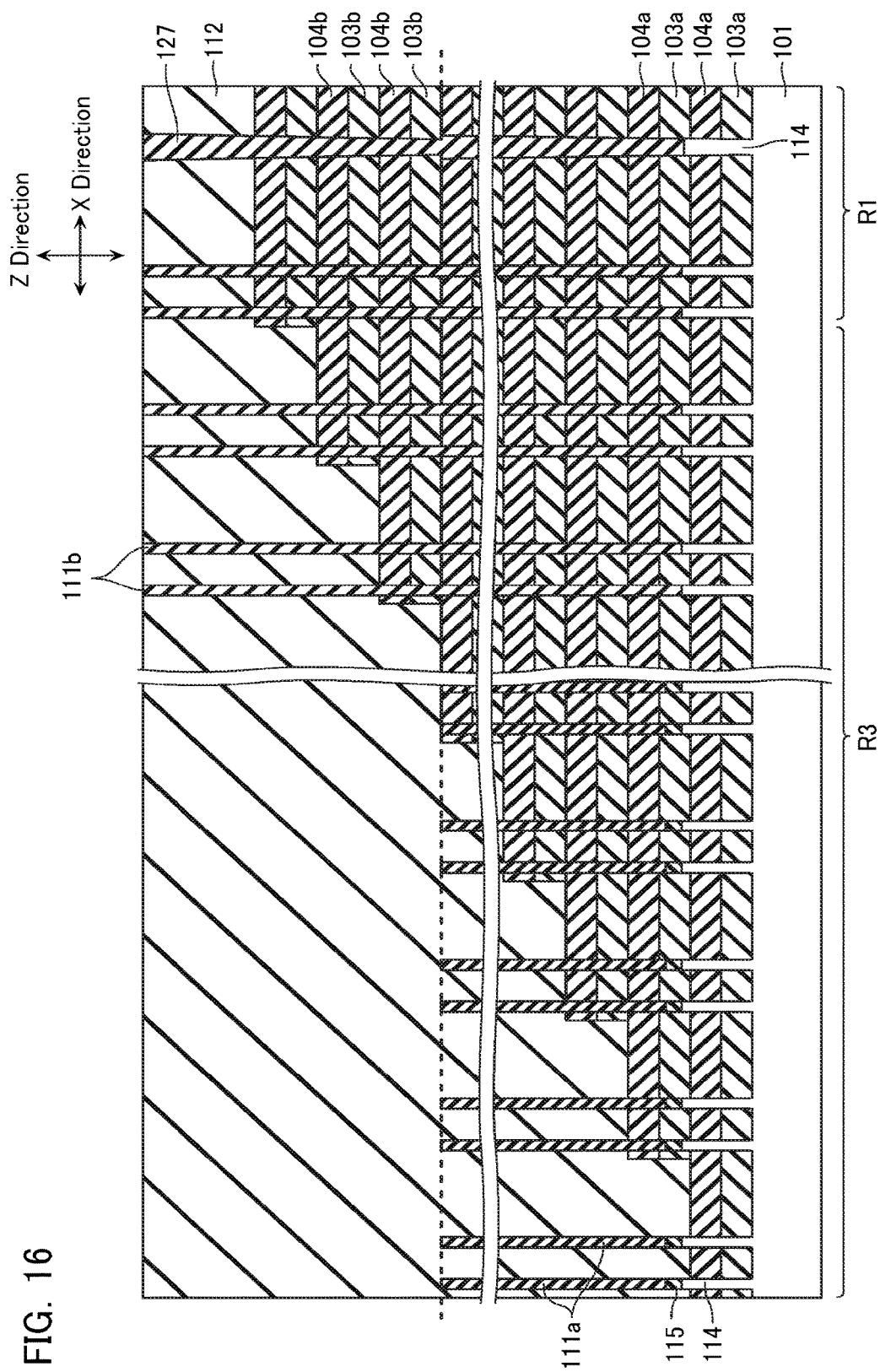

As shown in FIG. 16, the memory columnar body 127 is formed in the memory hole MH. Due to this step, the same stacked structure as that of the memory columnar body 127 (refer to FIG. 5) is formed also in the hole Ho2. This stacked structure forms the support column 111b. Moreover, in this step, all or part of the oxide layer 115 is removed in order to connect the semiconductor layer 122 of the memory columnar body 127 and the epitaxial layer 114.

Figure 17:
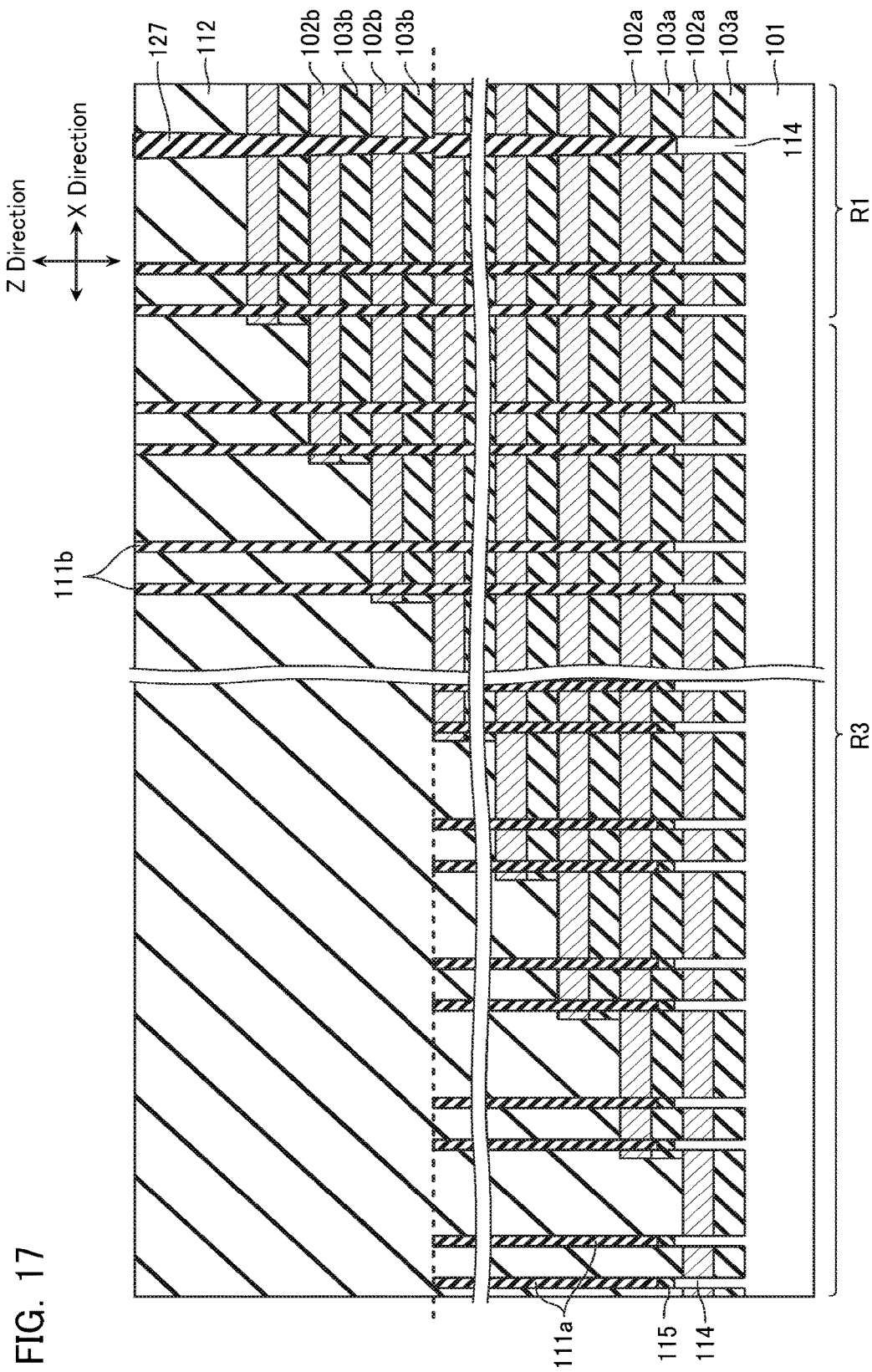

As shown in FIG. 17, the sacrifice layers 104a and 104b are removed via an unillustrated slit, and a metal such as tungsten is formed by the likes of a CVD method, thereby forming the conductive layers 102a and 102b. Note that in this step, after the sacrifice layers 104a and 104b have been removed, plasma oxidation or thermal oxidation processing is performed, and a side surface of the epitaxial layer 114 and a side surface of the support column 111a are oxidized. As a result, a short circuit between the metal configuring the conductive layers 102a and 102b and the epitaxial layer 114 and support column 111a is prevented.

Figure 18:
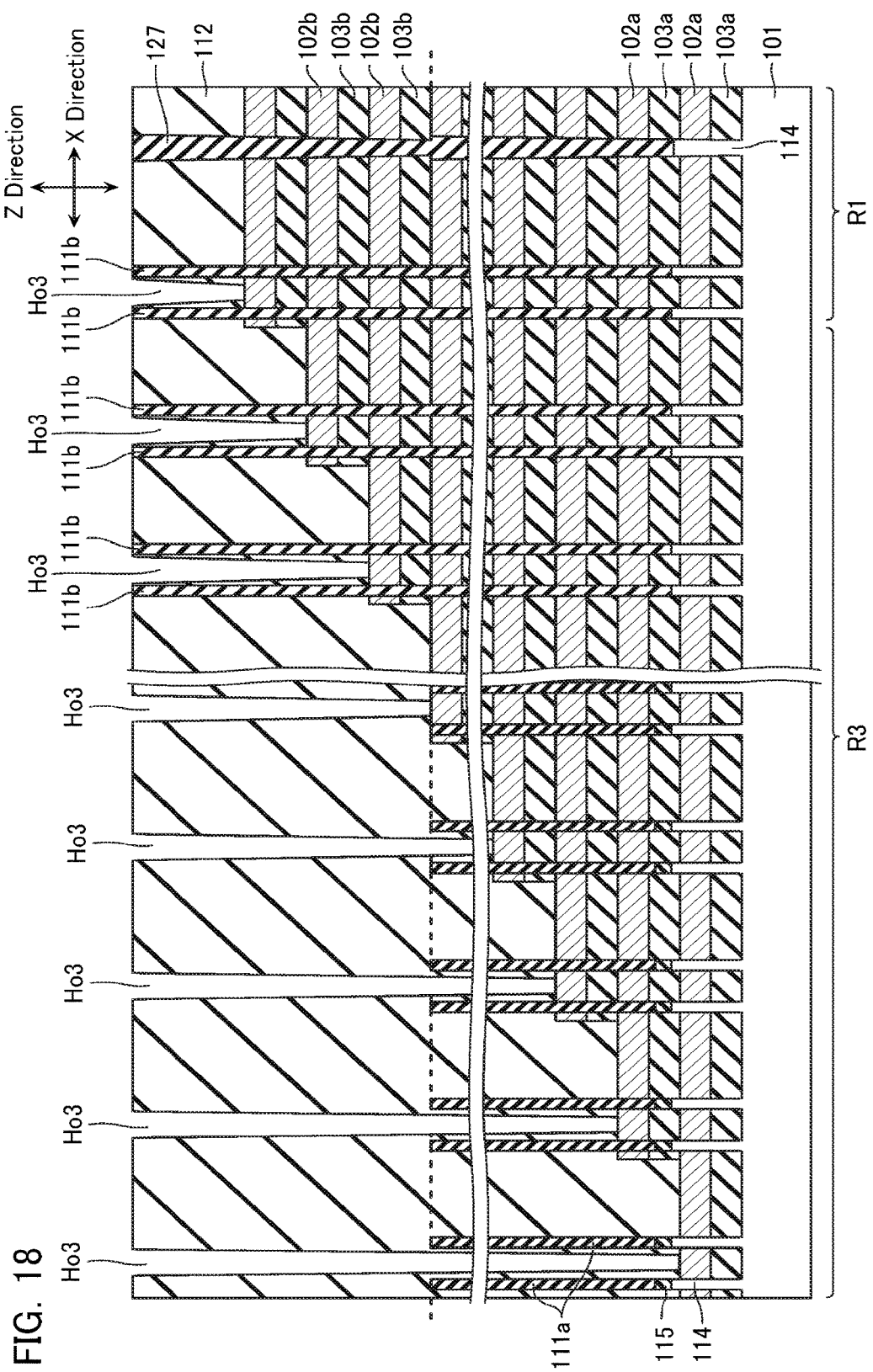

As shown in FIG. 18, patterning of a desired pattern corresponding to the contact 109a and the contact 109b is performed by lithography, and a third hole Ho3 is formed by RIE or wet etching.

Then, a conductive material such as tungsten is formed in the third hole Ho3 to form the contacts 109a and 109b, and the configuration of FIG. 7A is obtained.

As described above, in the present embodiment, by dividing into two the step of forming the support column 111, the support column 111a of height H1 and the support column 111b of height H2 are separately provided. Therefore, in the contact part 301a where the support column 111a is provided, it becomes easy to secure a margin for forming the contact 109a, and it becomes possible to reduce area of the contact part 301a.

Furthermore, by area of the contact part 301a being reduced, a width of the sacrifice layer 104a of that portion is also reduced. Therefore, in the step of replacing the sacrifice layer 104 by the conductive layer 102, of FIG. 17, a gap caused by removing the sacrifice layer 104 can also be reduced, and it also becomes possible for sagging of the inter-layer insulating layer 103 to be more suppressed.

Modified Example

Figure 19:
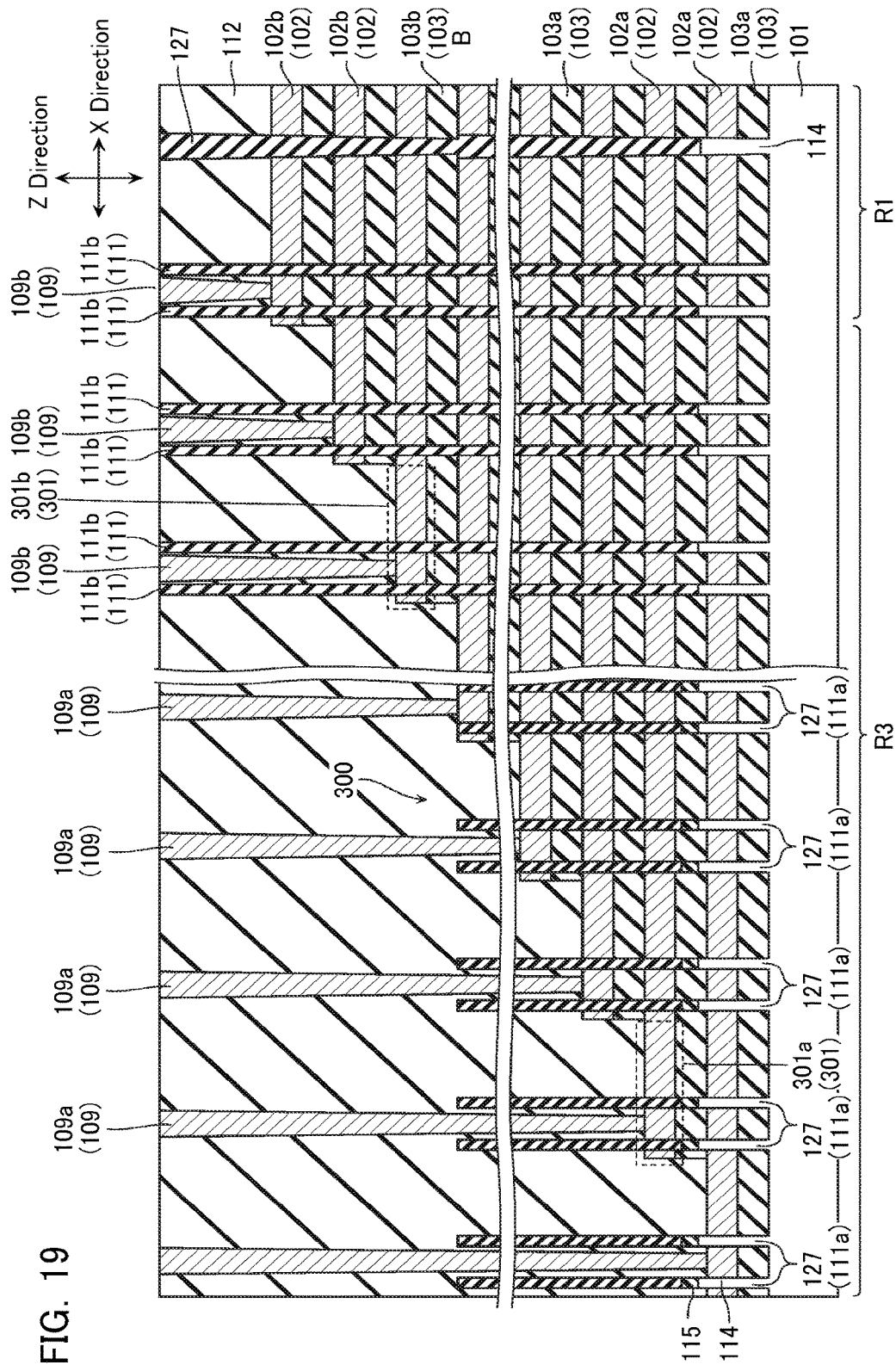
FIG. 19 is a schematic cross-sectional view showing a configuration of a semiconductor memory device according to a modified example.

The present embodiment was described assuming that the support column 111a is an insulator such as silicon oxide, or is a structure configured from an insulator such as silicon oxide formed on an inner wall of the hole Ho1 and from a conductive material such as silicon formed on the inside of that insulator. However, as shown in FIG. 19, in a modified example, the support column 111a may be a structure similar to the memory columnar body 127.

Figure 20:
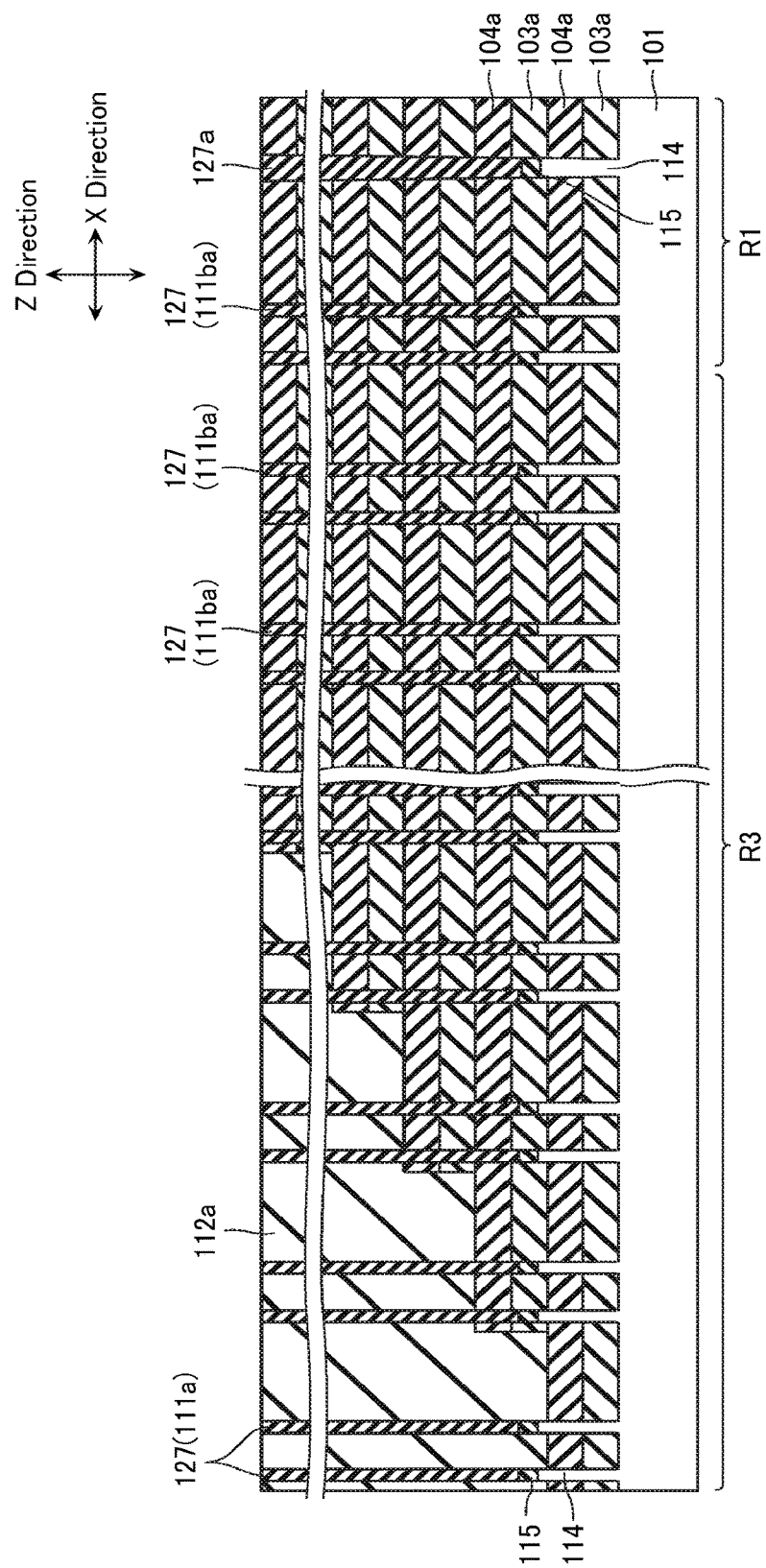
FIGS. 20 and 21 are schematic cross-sectional views showing a method of manufacturing the same semiconductor memory device.

A method of manufacturing according to the present modified example is largely similar to that of the first embodiment for configurations shown in FIGS. 8 to 11. After the step of FIG. 11, as shown in FIG. 20, the memory film 126 and the columnar semiconductor 105 shown in FIG. 5 are sequentially formed in the first memory hole MHa, the hole Ho1, and the hole Ho2a. As a result, a first memory columnar body 127a is formed in the first memory hole MHa, the support column 111a having the same structure as the memory columnar body 127 is formed in the hole Ho1, and a support column 111ba configuring a lower layer portion of the support column 111b is formed in the hole Ho2a.

Then, steps similar to the steps shown in FIGS. 13 and 14 of the first embodiment are performed.

Figure 21:
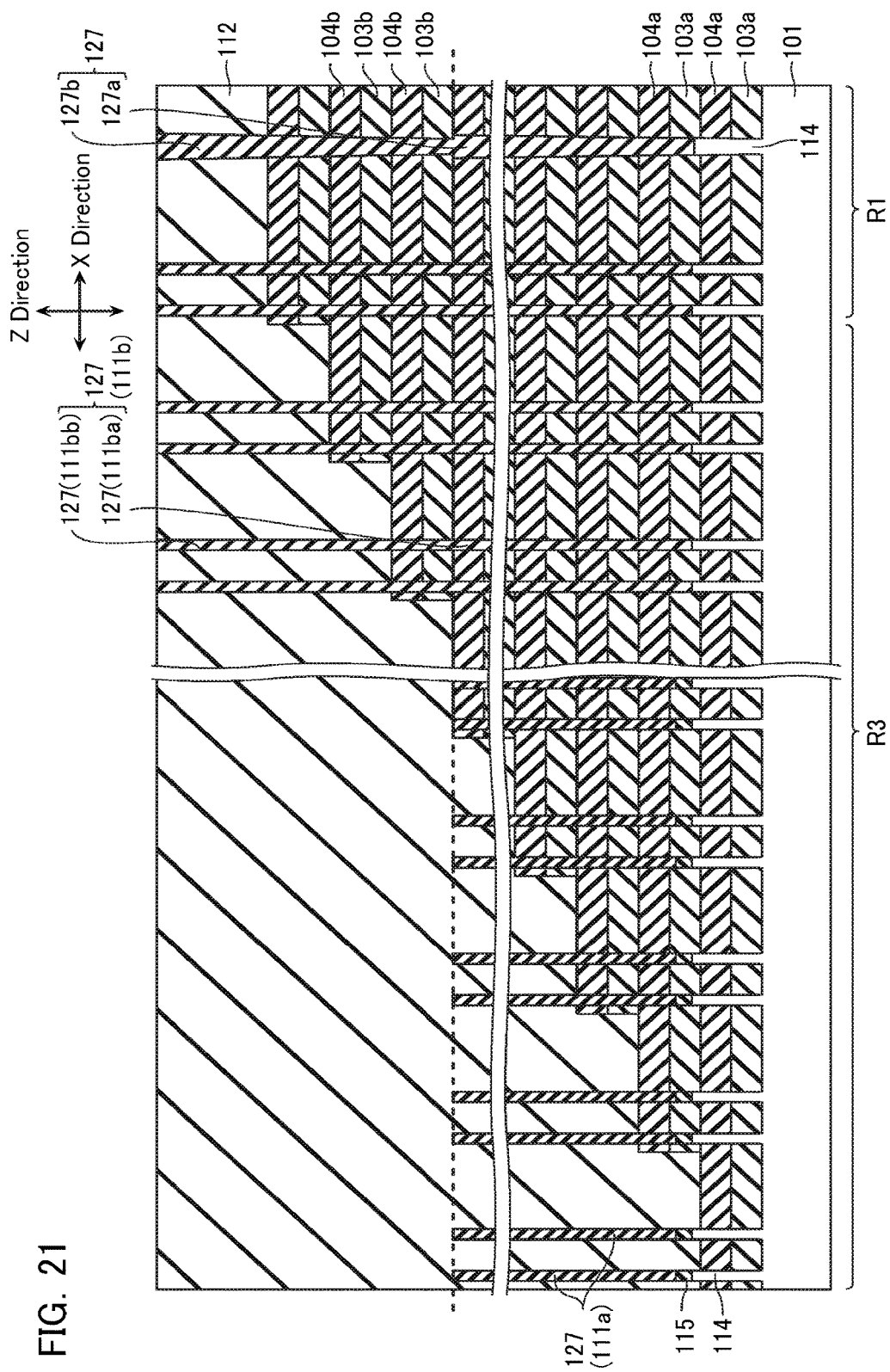

Then, after the step of FIG. 14, as shown in FIG. 21, the memory film 126 and the columnar semiconductor 105 shown in FIG. 5 are again sequentially formed on the first memory columnar body 127a and the support column 111ba, and a second memory columnar body 127b and a support column 111bb are formed. As a result, the memory columnar body 127 and the support column 111b are formed.

Similar advantages to those of the above-described embodiment are obtained also by this modified example. Moreover, since the step of removing the sacrifice layer 113 that was performed in FIG. 15 of the first embodiment is not performed, manufacturing steps are also simplified.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array region including a plurality of conductive layers that are electrically connected to a plurality of memory cells arranged in a first direction on a semiconductor substrate, the first direction intersecting a surface of the semiconductor substrate;
a stepped part for contacting the plurality of conductive layers to a wiring line;
a contact extending in the first direction and being connected to the conductive layer in the stepped part; and
a plurality of columnar bodies extending in the first direction, each columnar body including a support column extending in the first direction, and each columnar body penetrating through the conductive layer in the stepped part, the plurality of columnar bodies including a first columnar body having an upper end on an opposite side to the substrate at a first height from the surface of the semiconductor substrate and a second columnar body having an upper end on an opposite side to the substrate at a second height from the surface of the semiconductor substrate, the second height being lower than the first height.

2. The semiconductor memory device according to claim 1, wherein
the stepped part up to the second height has the second columnar body provided therein, and the stepped part above the second height has the first columnar body provided therein.

3. The semiconductor memory device according to claim 1, wherein
the second height is not less than half of the first height.

4. The semiconductor memory device according to claim 1, wherein
the stepped part is disposed on each of both sides sandwiching the memory cell array region.

5. The semiconductor memory device according to claim 1, wherein
the columnar body is composed of materials including oxygen and silicon.

6. The semiconductor memory device according to claim 1, wherein
the first columnar body and the second columnar body are composed of different materials.

7. The semiconductor memory device according to claim 1, wherein each of the plurality of memory cells includes a semiconductor layer extending in the first direction and a memory film provided on a side surface of the semiconductor layer, and the first columnar body includes the semiconductor layer and the memory film.

8. The semiconductor memory device according to claim 1, wherein a distance between extremities of the conductive layers adjacent in the first direction up to the conductive layer having the second height is shorter than that of the conductive layers adjacent in the first direction above the second height.

9. The semiconductor memory device according to claim 1, wherein the plurality of conductive layers configuring the stepped part each include a projecting part whose end projects more than an end of the conductive layer adjacent upwardly in the first direction, and the contact and the columnar body are provided in an identical one of the projecting parts.

10. The semiconductor memory device according to claim 9, wherein a distance between the first columnar body and the contact provided in one of the projecting parts is shorter than a distance between the second columnar body and the contact provided in another one of the projecting parts.

11. The semiconductor memory device according to claim 1, wherein the plurality of columnar bodies include a plurality of the first columnar bodies whose upper ends are located at the first height of same value from the surface of the substrate and a plurality of the second columnar bodies whose upper ends are located at the second height of same value from the surface of the substrate.

12. The semiconductor memory device according to claim 11, wherein the plurality of conductive layers stacked to a height above the second height are arranged in a first region of the stepped part where the plurality of first columnar bodies are provided, and the plurality of conductive layers stacked up to the second height are arranged in a second region of the stepped part where the plurality of second columnar bodies are provided.

* * * * *